United States Patent [19]
Kosiec

[11] Patent Number: 6,040,720
[45] Date of Patent: Mar. 21, 2000

[54] RESISTORLESS LOW-CURRENT CMOS VOLTAGE REFERENCE GENERATOR

[75] Inventor: Jeannie Han Kosiec, Schaumburg, Ill.

[73] Assignee: Motorola, Inc., Schaumburg, Ill.

[21] Appl. No.: 09/094,534

[22] Filed: Jun. 12, 1998

[51] Int. Cl.[7] ................................... H03K 5/153
[52] U.S. Cl. ............................. 327/83; 327/513
[58] Field of Search .................. 327/65, 68, 77, 327/78, 80, 81, 89, 512, 513, 83; 323/312, 313, 316

[56] References Cited

U.S. PATENT DOCUMENTS

| | | | |
|---|---|---|---|
| 5,099,146 | 3/1992 | Miki et al. | 327/77 |
| 5,285,168 | 2/1994 | Tomatsu et al. | 330/253 |
| 5,469,081 | 11/1995 | Horita et al. | 327/77 |

*Primary Examiner*—Jung Ho Kim
*Attorney, Agent, or Firm*—John G. Rauch; Brian M. Mancini

[57] ABSTRACT

A voltage reference generator (200) generates a temperature compensated voltage at an output (202). The voltage reference generator includes a first transistor (204) and a second transistor (206) series connected between a supply voltage and the output. The first transistor and the second transistor establishing the temperature compensated voltage in response to a bias current ($I_{BIAS}$) and a first bias voltage and a second bias voltage. The voltage reference generator further includes a current source (208) coupled to the first transistor and the second transistor to establish the bias current in the first transistor and the second transistor. The current source produces the first bias voltage and the second bias voltage.

5 Claims, 2 Drawing Sheets

RESISTORLESS LOW-CURRENT CMOS VOLTAGE REFERENCE GENERATOR

FIELD OF THE INVENTION

The present invention generally relates to voltage reference generator circuits. More particularly, the present invention relates to a complementary metal-oxide-semiconductor (CMOS) voltage reference generator circuit having low operating current while using no resistors.

BACKGROUND OF THE INVENTION

Reducing operating current of an integrated circuit is a key design goal for many products. Reduced operating current permits greater levels of integration and reduces the need for thermal management techniques. In circuit designs for battery operated, portable products, reduced current drain of individual circuits allows longer standby and operating life of the product and increases the time between recharging. Reduced operating current is almost always an important goal of any circuit design.

One way to reduce operating current is using high-value resistors to limit the current. For example, in a 2 volt system, a 1 MΩ resistor will limit the quiescent current to 2 $\mu$A, which is a suitable level for many small signal applications.

However, a typical low-cost CMOS integrated circuit fabrication process does not make available high-value resistors as part of the process flow. Such high-value resistors must be formed from a semiconductor layer having high sheet resistance, which is typically not required by any other component of a CMOS integrated circuit. Provision of high-value resistors can therefore only be achieved by adding such a layer to the process flow, which is prohibitively expensive and usually not an option for the circuit designer, or by using physically large resistors made from a low sheet resistance layer. Since minimizing integrated circuit surface area is a key design goal, use of such large resistors is usually avoided.

A further design goal for voltage reference generators is temperature compensation of the output voltage. A temperature compensated output voltage either tracks another signal's variation with temperature or is temperature invariant. Temperature compensation or temperature coefficient tracking is desirable for increasing the operating range of the circuit. A circuit using a reference voltage which does not properly track another signal will no longer function properly when operating temperature is outside a tracking range.

One particular circuit which requires temperature coefficient tracking is a folded cascode output stage. To match the temperature coefficient of the folded cascode output stage, a voltage reference should have the same temperature characteristic and should match the maximum pull up voltage of the folded cascode stage.

Accordingly, there is a need in the art for a voltage reference generator and associated output circuit which minimizes operating current without the use of high-valued resistors and which provides a temperature compensated output voltage, particularly for use with a folded cascode output stage.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
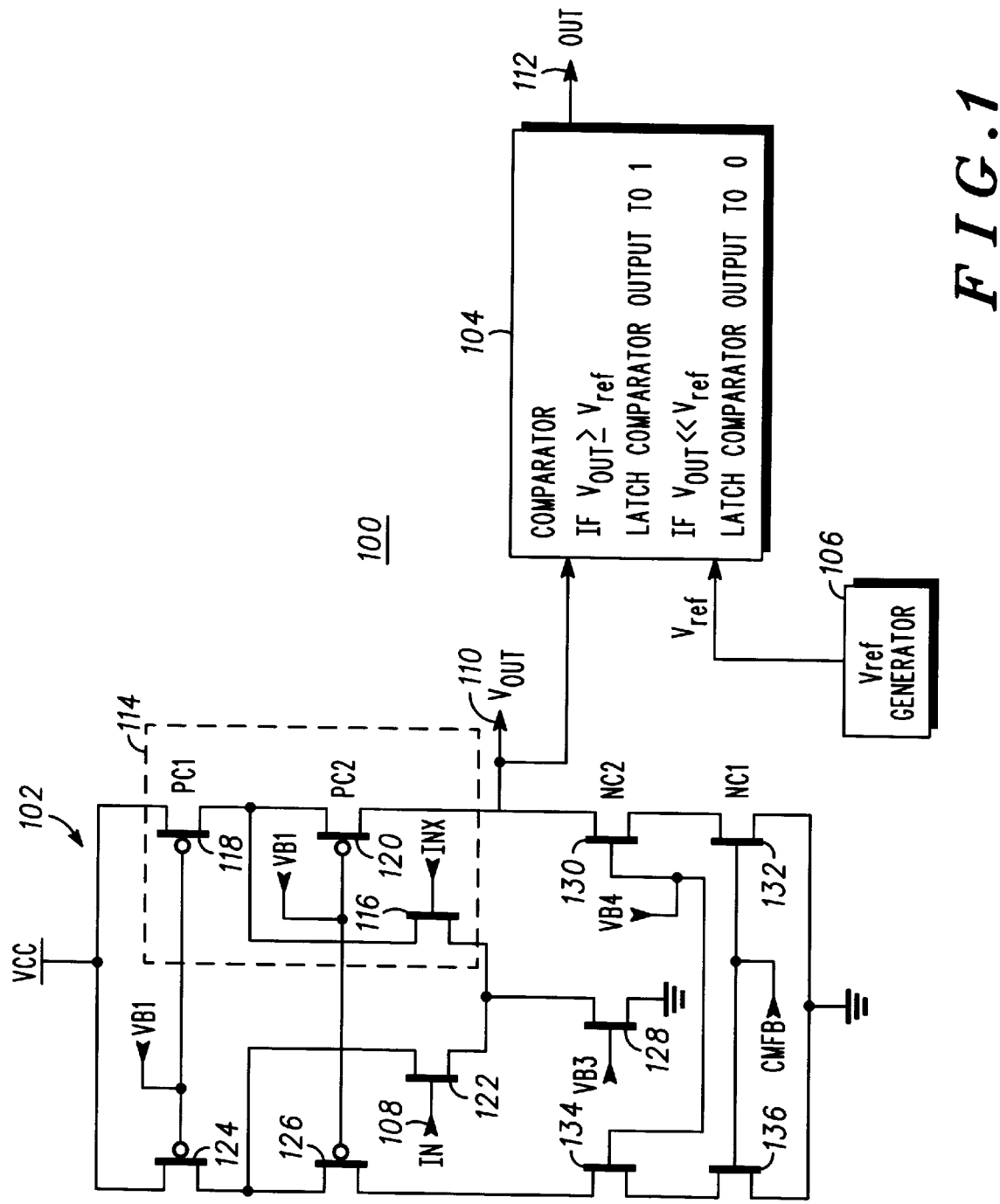
FIG. 1 is an output circuit in accordance with the present invention.

Referring now to FIG. 1, a circuit 100 includes an output circuit 102, a comparator output stage 104 and a voltage reference generator 106. The output circuit 102 receives an input voltage at an input 108 and produces an output voltage Vout at an output 110 in response to the received input voltage. The comparator output stage 104 compares the output voltage with a threshold voltage, labelled $V_{ref}$ in FIG. 1, and produces an output signal at an output 112.

The output circuit 102 may be a portion of another circuit such as an operational amplifier which produces the input voltage. The output circuit 102 includes a folded cascode output stage 114. The folded cascode output stage 114 includes a first transistor 116, a second transistor 118 and a third transistor 120. The first transistor 116 is an n-channel transistor with a gate coupled to a reference potential labelled INX. The second transistor 118, labelled PC1 in FIG. 1, is a p-channel transistor with a gate coupled to a reference potential labelled $V_{B1}$. The third transistor 120, labelled PC2, is also a p-channel transistor and has a gate coupled to a reference potential $V_{B2}$. The second transistor 116 and the third transistor 118 are series coupled between a reference potential $V_{cc}$ and the output 110. The drain of the first transistor 116 is commonly connected to the drain of the second transistor 118 and the source of the third transistor 120.

The output circuit 102 further includes a second cascode stage including transistor 122, transistor 124 and transistor 126. Transistor 122 has a gate coupled to the input 108 for receiving the input signal. Transistor 124 has a gate coupled to the reference potential $V_{B1}$. Transistor 126 has a gate coupled to the reference potential $V_{B2}$.

Transistor 122 and first transistor 116 together form a differential amplifier biased by the current source formed by transistor 128. Transistor 128 has a gate coupled to the reference potential $V_{B3}$ and a source coupled to ground and provides a substantially constant current to the differential amplifier. The current is steered between transistor 122 and first transistor 116 in response to the relative values of the input voltage and INX.

The output stage has a bias circuit including transistor 130, labelled NC2 in FIG. 1, and transistor 132, labelled NC1. Transistor 130 and transistor 132 are series coupled between the output 110 and the supply voltage, ground. Transistor 130 has a gate coupled to a reference potential $V_{B4}$. Transistor 132 has a gate coupled to the common mode feedback node labelled CMFB in FIG. 1 and receives a common mode feedback signal. The common mode feedback signal dynamically adjusts the direct current (DC) voltage at the output 110 to set the output DC voltage so as to maximize its alternating current (AC) dynamic range, thereby limiting clipping of the output voltage at the output. Transistor 124 and transistor 126 are similarly biased by transistor 134, with a gate coupled to $V_{B4}$ and transistor 136 with a gate coupled to the common mode feedback node.

The embodiment of the output circuit 102 is illustrative only and details of the design and modifications thereto are will within the purview of the person ordinarily skilled in the art. The reference potentials used to bias the circuit may be generated in any suitable manner, and common mode feedback circuits to generate the common mode feedback signal are known. The illustrated embodiment is symmetrical, but may be altered to reduce device count or current drain. Also, p-channel and n-channel devices may be swapped to accommodate circuit requirements.

In operation, the small signal input voltage at the input 108 is amplified by the differential amplifier and folded cascode output stage 114. The maximum value of the output voltage at the output 110, $Vout_{max}$, is set by the folded cascode output stage 114 and is less than a threshold voltage ($V_{tp}$) of either a p-channel or n-channel transistor below the supply voltage. The minimum level of the output voltage, $Vout_{min}$, is set by transistor 130 and transistor 132 as biased by the common mode feedback signal.

The comparator compares the output voltage at the output 110 and a reference voltage, labelled $V_{ref}$ and produces an output signal in response. For $V_{ref} \approx Vout_{max}$, if the output voltage is greater than $V_{ref}$, the output signal at the output 112 has a value interpreted as a logical 1. If the output voltage is less than $V_{ref}$, the output signal at the output 112 has a value interpreted as a logical 0.

The voltage reference generator 106 produces the reference voltage $V_{ref}$. For proper operation of the circuit, $V_{ref}$ should be approximately equal to $Vout_{max}$. However, $Vout_{max}$ will vary with temperature and other factors, such as supply voltage ($V_{cc}$) and process variation during manufacturing. These other factors may be negated by providing the same supply voltage to the output circuit 102 and the reference generator 106 and by combining them on the same integrated circuit. For temperature compensation, the voltage reference generator 106 should have a temperature characteristic that matches that of the folded cascode output stage 114 of the output circuit 102. It should reflect the maximum pull up voltage of the folded cascode output stage 114. Also, the voltage reference generator 106 should draw as little supply current as possible while guaranteeing normal operation during power on.

One possible circuit for producing $V_{ref}$ uses a p-channel current source and an n-channel current source in series to produce the necessary voltage. However, it is difficult to reliably match the p-channel and n-channel current sources so that they will track together over temperature, maintaining proper temperature compensation for $V_{ref}$.

Figure 2:
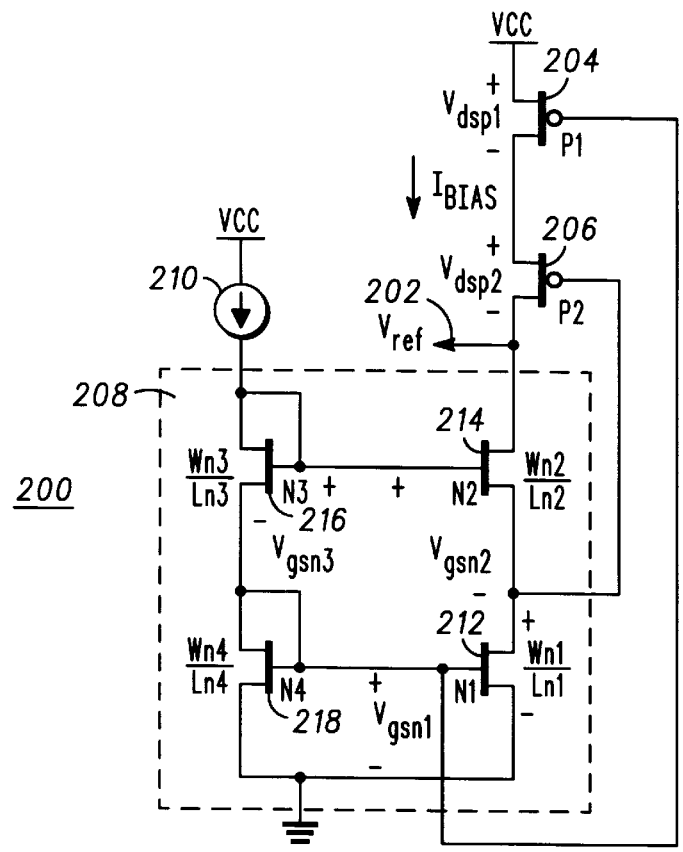
FIG. 2 is a first embodiment of a voltage reference generator circuit in accordance with the present invention.

FIG. 2 shows a first embodiment of a voltage reference generator 200 in accordance with the present invention. The voltage reference generator 200 may be used to implement the voltage reference generator 106 of FIG. 1. The voltage reference generator 200 generates a temperature compensated voltage at an output 202.

The voltage reference generator 200 includes a first transistor 204 and a second transistor 206 series connected between a supply voltage, $V_{cc}$, and the output 202. The first transistor 204 and the second transistor 206 establish the temperature compensated voltage in response to a bias current $I_{BIAS}$ and a first bias voltage and a second bias voltage. The first bias voltage is provided at the gate of the first transistor 204. The second bias voltage is provided at the gate of the second transistor 206.

The voltage reference generator 200 further includes a current source 208 coupled to the first transistor 204 and the second transistor 206 to establish the bias current $I_{BIAS}$ in the first transistor 204 and the second transistor 206. The current source 208 produces the first bias voltage and the second bias voltage. The current source 208 is biased by a current source 210, which may be constructed using any suitable design.

The current source 208 includes a third transistor 212, labelled N1 in FIG. 2, a fourth transistor 214, labelled N2, a fifth transistor 216, labelled N3, and a sixth transistor 218, labelled N4. Each transistor has a respective aspect ratio (gate width to length ratio W/L) indicated on FIG. 2.

The fifth transistor 216 and the fourth transistor 214 are mirror connected in that they have a common gate connection and the gate of fifth transistor 216 is coupled directly to its drain. Similarly, the sixth transistor 218 and the third transistor 212 are mirror connected. Because the sources of transistor 212 and transistor 218 are at the same potential, the drain current of the third transistor 212 will be a multiple of the drain current of the sixth transistor 218, with the multiple being set by the ratio of the width/length ratios of the two transistors.

The current source 210 establishes a current in the fifth transistor 216 and the sixth transistor 218. This current is mirrored in the third transistor 212 and the fourth transistor 214 to establish the bias current $I_{BIAS}$ in the first transistor 204 and the second transistor 206. The current source 208 generates the second bias voltage at the source of the fourth transistor 214 and generates the first bias voltage at the gate of the third transistor 212. From FIG. 2 it is clear that the first bias voltage is equal to $V_{gsn1}$. Similarly, the second bias voltage is equal to $V_{gsn1}+V_{gsn3}-V_{gsn2}$.

To obtain the same temperature characteristic as the folded cascode output stage 114 of FIG. 1, the reference voltage $V_{ref}$ must be generated with a circuit topology similar to that of the folded cascode output stage 114. This requirement dictates use of the series coupled devices, first transistor 204 and second transistor 206. To limit the current drain of the voltage reference generator 200, a fixed NMOS current source, current source 208 is connected to the cascaded PMOS devices P1 and P2. The NMOS current source also serves to match the operation of the folded cascode output stage 114 where the DC current at the two cascaded PMOS transistors (labelled PC1 and PC2 in FIG. 2) is set.

The operating voltages of the reference generator circuit 200 can be determined as follows.

$$V_{cc}-V_{gsp1}=V_{gsn1} \tag{1}$$

$$V_{cc}-V_{dsp1}-V_{gsp2}=V_{dsn1} \tag{2}$$

$$\text{Let } V_{gsn3}=V_{gsn1} \tag{3}$$

$$\text{Then } V_{dsn1}=2V_{gsn1}-V_{gsn2} \tag{4}$$

For the example of $V_{gsp2}=V_{gsp1}$, which implies $W_{p2}/L_{p2}=W_{p1}/L_{p1}$, then from (2)

$$V_{cc}-V_{dsp1}=V_{dsn1}. \tag{5}$$

Substituting (1) into (5)

$$V_{gsn1}-V_{dsp1}=V_{dsn1} \tag{6}$$

Rearranging (6), $$V_{dsp1}=V_{gsn1}-V_{dsn1} \tag{7}$$

For $V_{gsp2}=V_{gsp1}$, equation (2) becomes $$V_{dsn1}=(V_{cc}-V_{gsp1})-V_{dsp1}. \tag{8}$$

Substituting from (1), then $$V_{dsn1}=V_{gsn1}-V_{dsp1}. \quad (9)$$

Since $V_{dsn1}$ can also be written as $$V_{dsn1}=V_{gsn1}+V_{gsn3}-V_{gsn2}, \quad (10)$$

Combining (9) and (10) and rearranging, $$V_{gsn3}-V_{gsn2}+V_{dsp1}=0 \quad (11)$$

Since we have already assumed $V_{gsn3}=V_{gsn1}$, then $V_{dsp1}=V_{gsn2}-V_{gsn1}$, i.e., for proper operation, $V_{gsn2}$ must be greater than $V_{gsn1}$. This can be accomplished by manipulating the device width and length ratios. The output voltage $V_{ref}$ is $$V_{ref}=V_{cc}-V_{dsp1}-V_{dsp2} \quad (12)$$

If $W_{p2}/L_{p2}=W_{p1}/L_{p1}$ and $V_{gsp2}=V_{gsp1}$, then $V_{dsp1}=V_{dsp2}$ and $V_{ref}=V_{cc}-2V_{dsp1}$.
From (7), $$V_{ref}=V_{cc}-2(V_{gsn1}-V_{dsn1}) \quad (13)$$

From (11), $$V_{ref}=V_{cc}-2(V_{gsn1}-V_{gsn1}-V_{gsn3}+V_{gsn2}) \quad (14)$$

This final equation (14) for $V_{ref}$ is controlled by the gate-to-source ratio of the various devices, which in turn may be controlled by device size ratios. In addition, due to the series connected devices P1, P2, N2 and N2, $V_{ref}$ has the same temperature characteristic of $V_{out}$ in the folded cascode output stage 114 of FIG. 1.

Transistor 214 (labelled N2 in FIG. 2) is a necessary component of the voltage reference generator 200. It serves to increase the output impedance of the current source 208, and its size (width to length ratio) may be scaled so that the source to drain voltage of transistor 212 ($V_{dsn1}$) is less than the gate to source voltage of transistor 212 ($V_{gsn1}$) for a final reference voltage $V_{ref}$ closer to the supply voltage $V_{cc}$. If $V_{dsn1}$ is greater than $V_{gsn1}$, then the final voltage reference $V_{ref}$ will be closer to mid-supply (i.e., $V_{cc}/2$).

The gate voltages of the first transistor 204 and the second transistor 206 as connected in FIG. 2 guarantee that these transistors are in saturation. In fact, they are operating as switches in low-resistance position, with their respective on resistance $R_{ds}$ between the drain and source. $R_{ds}$ is a function of drain current ($I_{ds}$), gate bias ($V_{gs}$) and device size. In the circuit of FIG. 2, the drain current is fixed by the NMOS current source 208. Assuming that first transistor 204 and second transistor 206 are of the same device size as derived in the above equations, if $V_{gsp1}$ equals $V_{gsp2}$ then $V_{dsp1}$ is equal to $V_{dsp2}$ and the output voltage $V_{ref}$ is substantially 2 $V_{dsp1}$ below the supply potential $V_{cc}$. $V_{gsp1}$ will equal $V_{gsp2}$ if $V_{dsn1}$ is less than $V_{gsn1}$ as controlled by the ratio $(Wn_{n2}/L_{n2})/(W_{n3}/L_{n3})$. In addition, $V_{ref}$ can be made a fraction of a typical $V_{gs}$ voltage. The output voltage $V_{ref}$ can be adjusted by varying the device size of second transistor 206 with respect to first transistor 204. The output voltage $V_{ref}$ can also be adjusted by varying the gate voltage of second transistor 206 with the device size of transistor 214.

Figure 3:
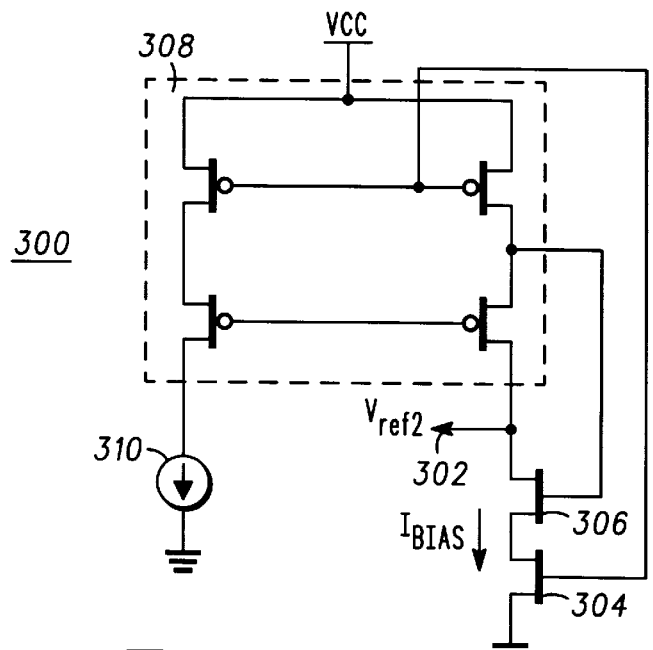
FIG. 3 is a second embodiment of a voltage reference generator circuit in accordance with the present invention.

Referring now to FIG. 3, it shows a second embodiment of a voltage reference generator 300. In the voltage reference generator 300, the devices and connections have been complemented relative to the voltage reference generator 200 of FIG. 2. The voltage reference generator 300 generates a temperature compensated reference voltage at an output 300. The voltage reference generator 300 of FIG. 3 is particularly well suited to generation of a reference potential near more negative supply voltage or ground in FIG. 3.

The voltage reference generator 300 includes a first transistor 304 and a second transistor 306 series connected between a supply voltage, ground and the output 302. The first transistor 304 and the second transistor 306 establish the temperature compensated voltage in response to a bias current $I_{BIAS}$ and a first bias voltage and a second bias voltage. The first bias voltage is provided at the gate of the first transistor 304. The second bias voltage is provided at the gate of the second transistor 306.

The voltage reference generator 300 further includes a current source 308 coupled to the first transistor 304 and the second transistor 306 to establish the bias current $I_{BIAS}$ in the first transistor 304 and the second transistor 306. The current source 308 produces the first bias voltage and the second bias voltage. The current source 308 is biased by a current source 310, which may be constructed using any suitable design.

The remaining connections and operation of the voltage reference generator 300 are substantially similar to those described above for the voltage reference generator 200 of FIG. 2, with the necessary complementing of polarities between NMOS and PMOS devices. Accordingly, further discussion will be omitted here.

As can be seen from the foregoing, the present invention provides a voltage reference generator and associated output circuit which minimizes operating current without the use of high-valued resistors and which provides a temperature compensated output voltage, particularly for use with a folded cascode output stage. The voltage reference generator according to the present invention has many advantages. It can operate with very little current. In one simulation, the supply current for the voltage reference generator was only 2 $\mu$A. Since the circuit consists of only CMOS elements, it occupies very little silicon area, particularly in comparison to a circuit using a resistor large enough to limit the current to 2 $\mu$A. Since no resistors are used, a less expensive fabrication process which does not include resistors can be used for manufacture. The output voltage can be easily adjusted by varying transistor sizes. The temperature characteristic of the reference voltage tracks that of a folded cascode output stage. Lastly, the voltage reference generator is guaranteed to turn on, ensuring proper operation at circuit initialization.

While a particular embodiment of the present invention has been shown and described, modifications may be made. It is therefore intended in the appended claims to cover all such changes and modifications which fall within the true spirit and scope of the invention.

What is claimed is:

1. A ciruit with a temperature compensated output, comprising:
    an output circuit including a folded cascode output stage, the output circut producing an output voltage in response to an input voltage, the folded cascode output stage producing the output voltage with a temperature characteristic of the folded cacode output stage;
    a comparator stage which compared the output voltage with a threshold voltage and produces an output signal; and
    a voltage reference generator for producing the threshold voltage with the temperature characteristic of the folded cascode output stage, the voltage reference generator including
        a first transistor and a second transistor series coupled between a reference potential and the comparator stage, and a current source for biasing the first transistor and the second transistor so that the threshold voltage has the temperature characteristic of the folded cascode ourput stage.

2. A circuit as recited in claim 1 further comprising:

a bias current source which establishes an operating current, the current source including a current mirror which mirrors the operating current to the first transistor and the second transistor as a bias current for biasing the first transistor and the second transistor.

3. A circuit as recited in claim 1 wherein the first and second transistors are series connected between a supply voltage and an output producing the threshold voltage, the first and second transistors establishing the temperature compensating threshold voltage in response to a bias current, a first bias voltage, and a second bias voltage, the current source establishing the bias current in the first transistor and the second transistor so as to produce the first bias voltage and the second bias voltage.

4. A circuit as recited in claim 3 wherein the first bias voltage and the second bias voltage bias the first transistor and the second transistor to ensure current flow therein during power up of the voltage reference generator.

5. A circuit as recited in claim 3 wherein the current source comprises:

a third transistor having a drain, a source coupled to the reference potential, and a gate coupled to the gate of the first transistor to provide the first bias voltage to the first transistor; and a fourth transistor having a drain coupled to the output producing the threshold voltage and a source coupled to the drain of the third transistor and coupled to a gate of the second transistor to provide the second bias voltage to the second transistor.

* * * * *

UNITED STATES PATENT AND TRADEMARK OFFICE
CERTIFICATE OF CORRECTION

| | |
|---|---|
| PATENT NO. | : 6,040,720 |
| DATED | : March 21, 2000 |
| INVENTOR(S) | : Kosiec, Jeannie H. |

Page 1 of 1

It is certified that error appears in the above-identified patent and that said Letters Patent is hereby corrected as shown below:

Column 6, line 58 replace "compared" with ----compares----.

Signed and Sealed this

Fifth Day of June, 2001

Attest:

Attesting Officer

NICHOLAS P. GODICI
*Acting Director of the United States Patent and Trademark Office*